US012685213B2

(12) United States Patent
Ahn et al.

(10) Patent No.: US 12,685,213 B2
(45) Date of Patent: Jul. 14, 2026

(54) SEMICONDUCTOR PACKAGE AND METHOD FOR MANUFACTURING THE SEMICONDUCTOR PACKAGE

(71) Applicant: SAMSUNG ELECTRONICS CO., LTD., Suwon-si (KR)

(72) Inventors: Seokgeun Ahn, Suwon-si (KR); Seokhyun Lee, Suwon-si (KR); Hwanyoung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 497 days.

(21) Appl. No.: 18/135,541

(22) Filed: Apr. 17, 2023

(65) Prior Publication Data

US 2024/0014086 A1     Jan. 11, 2024

(30) Foreign Application Priority Data

Jul. 7, 2022     (KR) ........................ 10-2022-0083916

(51) Int. Cl.
| | |
|---|---|
| *H01L 23/31* | (2006.01) |
| *H10W 20/42* | (2026.01) |
| *H10W 70/65* | (2026.01) |
| *H10W 74/01* | (2026.01) |
| *H10W 74/10* | (2026.01) |
| *H10W 74/15* | (2026.01) |

(Continued)

(52) U.S. Cl.
CPC ......... *H10W 74/129* (2026.01); *H10W 20/42* (2026.01); *H10W 70/65* (2026.01); *H10W 74/012* (2026.01); *H10W 74/15* (2026.01);

*H10W 90/00* (2026.01); *H10W 72/9226* (2026.01); *H10W 72/923* (2026.01); *H10W 72/9413* (2026.01); *H10W 74/00* (2026.01); *H10W 90/297* (2026.01); *H10W 90/724* (2026.01)

(58) Field of Classification Search
None
See application file for complete search history.

(56) References Cited

U.S. PATENT DOCUMENTS

| | | |
|---|---|---|
| 8,994,155 B2 | 3/2015 | Tsai et al. |
| 10,157,888 B1 | 12/2018 | Lin et al. |

(Continued)

*Primary Examiner* — Long Pham
(74) *Attorney, Agent, or Firm* — Sughrue Mion, PLLC

(57) ABSTRACT

A semiconductor package includes: a substrate; a circuit layer disposed on a lower surface of the substrate, the circuit layer including an interconnection structure; a first redistribution structure disposed adjacent to the circuit layer, the first redistribution structure including a first redistribution layer; a connection structure including a first connection via electrically connected to the first redistribution layer, a second connection via electrically connected to the interconnection structure, and a connection interconnection interconnecting the first and second connection vias; a semiconductor chip disposed below the first redistribution structure, and electrically connected to the first redistribution layer; a first vertical connection structure disposed on a lower surface of the circuit layer; a second vertical connection structure disposed on a lower surface of the connection structure; and a second redistribution structure disposed below the semiconductor chip and the first and second vertical connection structures.

20 Claims, 12 Drawing Sheets

(51) Int. Cl.
_H10W 90/00_      (2026.01)
_H10W 72/90_      (2026.01)
_H10W 74/00_      (2026.01)
_H10W 90/20_      (2026.01)

(56)                    References Cited

U.S. PATENT DOCUMENTS

| | | | | |
|---|---|---|---|---|
| 10,163,798 | B1 * | 12/2018 | Alur | H10W 70/05 |
| 10,224,272 | B2 * | 3/2019 | Kim | H10W 70/05 |
| 11,227,837 | B2 | 1/2022 | Yu et al. | |
| 12,388,046 | B2 * | 8/2025 | Kim | H10W 90/00 |
| 2017/0309588 | A1 | 10/2017 | Wu et al. | |
| 2018/0040548 | A1 * | 2/2018 | Kim | H10W 70/05 |
| 2020/0006232 | A1 * | 1/2020 | Pietambaram | H10P 72/74 |
| 2020/0395300 | A1 * | 12/2020 | Xie | H10W 70/611 |
| 2020/0395313 | A1 * | 12/2020 | Mallik | H10W 42/121 |
| 2021/0193581 | A1 | 6/2021 | Seo et al. | |
| 2021/0358875 | A1 | 11/2021 | Lee et al. | |
| 2022/0028791 | A1 | 1/2022 | Choi | |
| 2022/0352107 | A1 * | 11/2022 | Shim | H10W 70/611 |

* cited by examiner

SEMICONDUCTOR PACKAGE AND METHOD FOR MANUFACTURING THE SEMICONDUCTOR PACKAGE

CROSS-REFERENCE TO RELATED APPLICATION

This application claims priority to Korean Patent Application No. 10-2022-0083916, filed on Jul. 7, 2022, with the Korean Intellectual Property Office, the disclosure of which is incorporated by reference herein in its entirety.

BACKGROUND

The present disclosure relates to a semiconductor package.

Implementation of weight reductions and high performance in electronic devices may require miniaturization and high performance in the field of semiconductor packages. In order to realize miniaturization, weight reduction, high performance, high capacitance, and high reliability of a semiconductor package, research and development of a semiconductor package having a structure in which semiconductor chips are stacked in multiple stages is continuously being conducted.

SUMMARY

One or more example embodiments provide a semiconductor package having improved electrical characteristics and reliability.

According to an aspect of an example embodiment, a semiconductor package includes: a substrate; a circuit layer disposed on a lower surface of the substrate, the circuit layer comprising an interconnection structure; a first redistribution structure disposed adjacent to the circuit layer on the lower surface of the substrate, the first redistribution structure comprising a first redistribution layer; a connection structure comprising a first connection via electrically connected to the first redistribution layer, a second connection via electrically connected to the interconnection structure, and a connection interconnection disposed below the first connection via and the second connection via and interconnecting the first connection via and the second connection via; a semiconductor chip disposed below the first redistribution structure, and electrically connected to the first redistribution layer; a first vertical connection structure disposed on a lower surface of the circuit layer; a second vertical connection structure disposed on a lower surface of the connection structure; and a second redistribution structure disposed below the semiconductor chip and the first and second vertical connection structures, the second redistribution structure comprising a second redistribution layer.

According to an aspect of an example embodiment, a semiconductor package includes: a substrate; a circuit layer disposed on a lower surface of the substrate, the circuit layer comprising an interconnection structure and an interlayer insulating layer surrounding the interconnection structure; a first redistribution structure disposed adjacent to the circuit layer on the lower surface of the substrate, the first redistribution structure comprising a first redistribution layer and a first redistribution insulating layer surrounding the first redistribution layer; a connection insulating layer having an upper surface in contact with each of a lower surface of the first redistribution insulating layer and a lower surface of the interlayer insulating layer; a semiconductor chip disposed below the first redistribution structure and electrically connected to the first redistribution layer; an underfill layer disposed between the first redistribution structure and the semiconductor chip; a first vertical connection structure disposed on a lower surface of the circuit layer; a second vertical connection structure disposed on a lower surface of the connection insulating layer; and a second redistribution structure disposed below the first vertical connection structure and the second vertical connection structure, the second redistribution structure comprising a second redistribution layer, wherein the interlayer insulating layer and the first redistribution insulating layer comprise different materials.

According to an aspect of an example embodiment, a semiconductor package includes: a substrate; a circuit layer disposed on a lower surface of the substrate, the circuit layer comprising an interconnection structure; a first redistribution structure disposed adjacent to the circuit layer on the lower surface of the substrate, the first redistribution structure comprising a first redistribution layer; a connection structure comprising a connection interconnection electrically connected to each of the interconnection structure and the first redistribution layer, and a connection insulating layer covering the connection interconnection; a semiconductor chip disposed below the first redistribution structure, and electrically connected to the first redistribution layer; a first vertical connection structure disposed on a lower surface of the circuit layer; a second vertical connection structure disposed on a lower surface of the connection structure; and a second redistribution structure disposed below the first and second vertical connection structures, the second redistribution structure comprising a second redistribution layer, wherein the second vertical connection structure is in contact with the connection insulating layer, and is electrically connected to the second redistribution layer.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Figure 1:
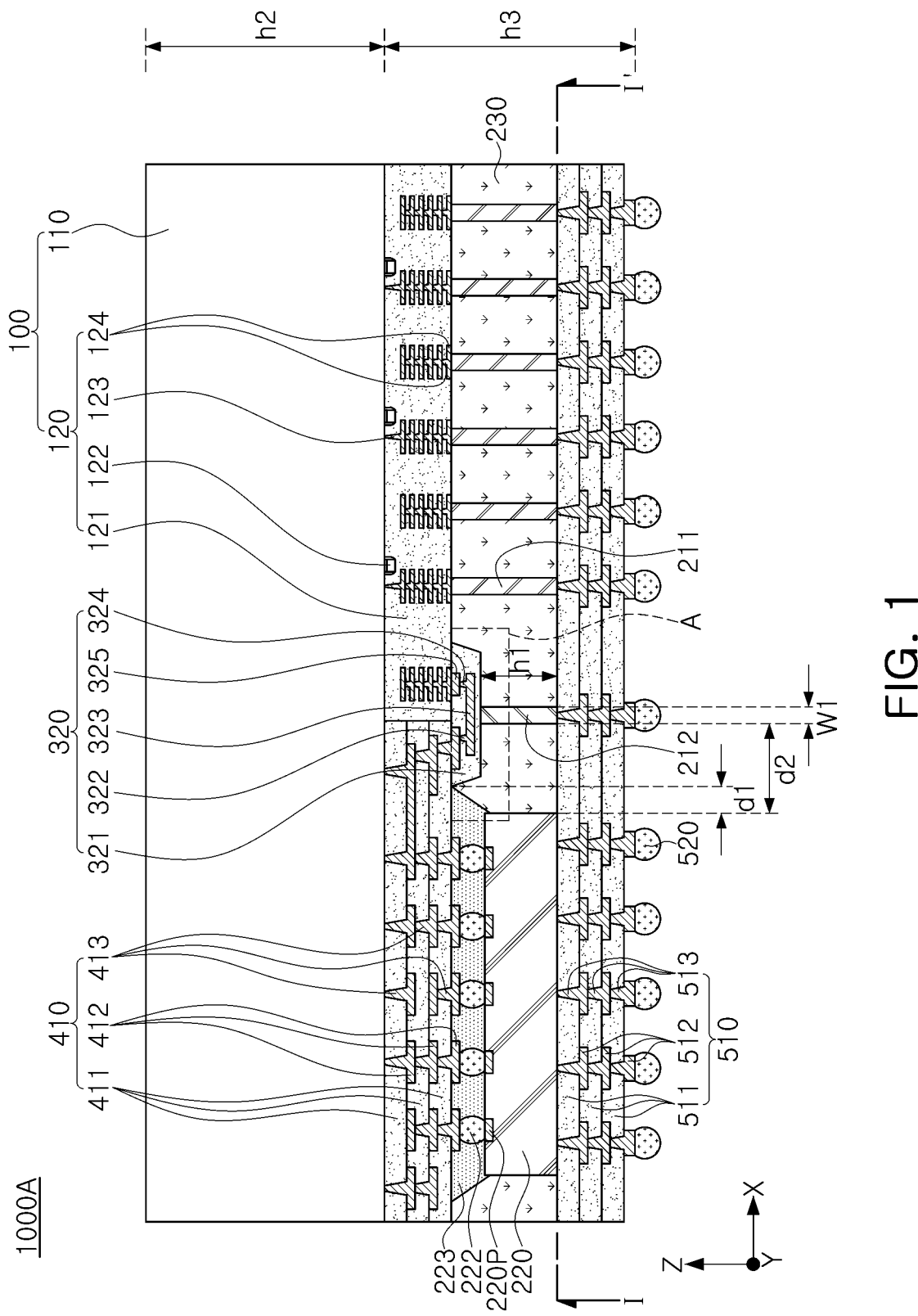
FIG. 1 is a cross-sectional view illustrating a semiconductor package according to an example embodiment.

Example embodiments will be described more fully with reference to the accompanying drawings, in which example embodiments are shown. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Terms such as 'an upper side, 'an upper portion', 'an upper surface', a lower side, a lower portion, a lower surface, and the like, may be understood as referring to the drawings, except where otherwise indicated by reference numerals.

FIG. 1 is a cross-sectional view illustrating a semiconductor package according to an example embodiment.

Figure 2:
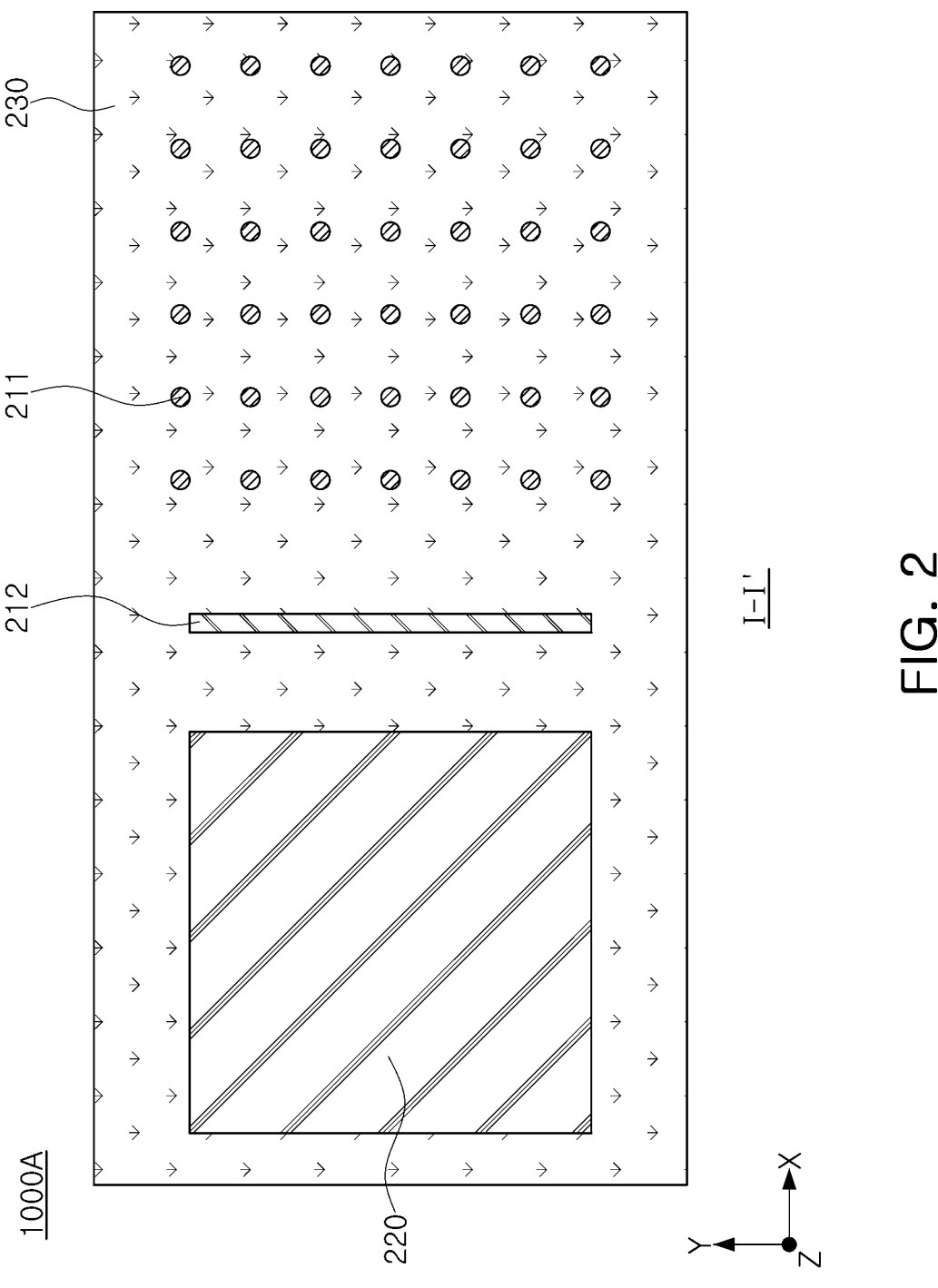
FIG. 2 is a plan view of a semiconductor package according to an example embodiment.

FIG. 2 is a plan view of a semiconductor package according to an example embodiment.

Referring to FIGS. 1 and 2, a semiconductor package 1000A may include a first semiconductor chip 100, a second semiconductor chip 220, a bump 222, an underfill layer 223, an encapsulant 230, first and second vertical connection structures 211 and 212, a connection structure 320, a first redistribution structure 410, a second redistribution structure 510, and an external connection terminal 520.

The first semiconductor chip 100 may include a substrate 110 and a circuit layer 120.

The substrate 110 may be a semiconductor wafer including a semiconductor element such as silicon and germanium, or a compound semiconductor such as silicon carbide (SiC), gallium arsenide (GaAs), indium arsenide (InAs), and indium phosphide (InP). The substrate 110 may have an active surface (e.g., a surface facing the circuit layer 120) having an active region doped with impurities and an inactive surface opposite thereto. FIG. 1 illustrates that an upper surface of the first semiconductor chip 100 is a rear surface of the first semiconductor chip 100, but example embodiments are not limited thereto. For example, a protective layer may be formed above the substrate 110 and be the rear surface of the first semiconductor chip 100. The protective layer may be formed of an insulating material such as silicon oxide, silicon nitride, or silicon oxynitride, but may also be formed of an insulating polymer according to an example embodiment. A height h2 of the substrate 110 may have a value in a range of about 0.005 mm to about 1 mm, and a sum of heights of the circuit layer 120, the first vertical connection structure 211, and the second redistribution structure 510 may have a value in a range of about 0.01 mm to about 1 mm.

The circuit layer 120 is disposed on a lower surface of the substrate 110, and may include an interlayer insulating layer 121 and an interconnection structure 124. The interlayer insulating layer 121 may include Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or a combination thereof. At least a portion of the interlayer insulating layer 121 surrounding the interconnection structure 124 may be formed of a low dielectric layer. The interlayer insulating layer 121 may be formed using a chemical vapor deposition (CVD) process, a flowable-CVD process, or a spin coating process. The interconnection structure 124 may be formed in a multilayer structure including an interconnection pattern and vias formed of, for example, aluminum (Al), gold (Au), cobalt (Co), copper (Cu), nickel (Ni), lead (Pb), tantalum (Ta), tellurium (Te), titanium (Ti), tungsten (W), or a combination thereof. A barrier film (not shown) including titanium (Ti), titanium nitride (TiN), tantalum (Ta), or tantalum nitride (TaN) may be disposed between the interconnection pattern or/and the via and the interlayer insulating layer 121. Individual devices 122 constituting an integrated circuit may be disposed on a lower surface (or active surface) of the substrate 110. In this case, the interconnection structure 124 may be electrically connected to the individual devices 122 by an interconnection portion 123 (e.g., a contact plug). The individual devices 122 may include FET such as a planar field effect transistor (FET) or a FinFET, memory devices such as a flash memory, a dynamic random access memory (DRAM), a static random access memory (SRAM), an electrically erasable programmable read-only memory (EE-PROM), a phase-change random access memory (PRAM), a magnetoresistive random access memory (MRAM), a ferroelectric random access memory (FeRAM), a resistive random access memory (RRAM), and the like, logic devices such as AND, OR, NOT, and the like, and various active and/or passive devices such as a system large scale integration (LSI), a CMOS Imaging Sensor (CIS), and a micro-electro-mechanical system (MEMS).

The second semiconductor chip 220 may be disposed below the first redistribution structure 410, and may be disposed on the second redistribution structure 510. An upper surface of the second semiconductor chip 220 may be in contact with a lower surface of the underfill layer 223, and a portion of a side surface of the second semiconductor chip 220 may be surrounded by the underfill layer 223 and the encapsulant 230. A lower surface of the second semiconductor chip 220 may be in contact with an upper surface of a second redistribution via 513. The second semiconductor chip 220 may include a connection pad 220P, and the connection pad 220P may be electrically connected to a first redistribution layer 412 and a first redistribution via 413 by bumps 222. An area of the second semiconductor chip 220 in a horizontal direction of the second semiconductor chip 220 may have a value in a range of about 5% to about 99% of an area of the substrate 110 in a horizontal direction.

The bump 222 may be disposed between the connection pad 220P and the first redistribution layer 412. An upper surface of the bump 222 may be in contact with a lower surface of the first redistribution layer 412, and a lower surface of the bump 222 may be in contact with an upper surface of the connection pad 220P A portion of the bump 222 may be surrounded by the underfill layer 223. The bump 222 may include a metal, for example, copper (Cu) or an alloy of copper (Cu). The bump 222 may include a solder ball or a copper pillar.

The underfill layer 223 may surround the bump 222 between the second semiconductor chip 220 and the first redistribution structure 410. In addition, the underfill layer 223 may surround a portion of a side surface of the second semiconductor chip 220. The underfill layer 223 may fix the second semiconductor chip 220 on a lower surface of the first redistribution structure 410. The underfill layer 223 may have an inclined side surface. A side surface of the underfill layer 223 may be in contact with a side surface of the connection insulating layer 321. The underfill layer 223 may include at least one of an insulating polymer and an epoxy resin. For example, the underfill layer 223 may include an epoxy molding compound (EMC).

The encapsulant 230 may be disposed below the first redistribution structure 410 and the circuit layer 120, and may encapsulate at least a portion of each of the first and second vertical connection structures 211 and 121, the second semiconductor chip 220, and the connection structure 320. The encapsulant 230 may include an insulating material, and as the insulating material, a material including an inorganic filler and an insulating resin, for example, a thermosetting resin such as an epoxy resin, a thermoplastic resin such as polyimide, or a resin including a reinforcing material such as an inorganic filler therein, specifically ABF, FR-4, BT, a resin, or the like, may be used. In addition, a molding material such as EMC or a photosensitive material such as a Photo Imagable Encapsulant (PIE) may be used.

The first vertical connection structure 211 may be disposed between the circuit layer 120 and the second redistribution structure 510. An upper surface of the first vertical connection structure 211 may be in contact with a lower surface of the interconnection structure 124, and a lower surface of the first vertical connection structure 211 may be in contact with an upper surface of a second redistribution via 513. The first vertical connection structure 211 may form an electrical path penetrating through the encapsulant 230. The first vertical connection structure 211 may include a conductive material. The first vertical connection structure 211 may be completely filled with a conductive material, and may have, for example, a cylindrical shape or a polygonal pillar shape. The shape of the first vertical connection structure 211 is not particularly limited and may have various shapes. The first vertical connection structure 211 may be connected to the interconnection structure 124 and the second redistribution via 513. The first vertical connection structure 211 may be electrically connected to the interconnection portion 123, the individual devices 122, the connection structure 320, the first redistribution structure 410, and the second semiconductor chip 220 through the interconnection structure 124, and may be electrically connected to a second redistribution layer 512 and the external connection terminal 520 through the second redistribution via 513.

The second vertical connection structure 212 may be disposed between the connection structure 320 and the second redistribution structure 510. An upper surface of the second vertical connection structure 212 may be in contact with a lower surface of the connection insulating layer 321, and a lower surface of the second vertical connection structure 212 may be in contact with an upper surface of the second redistribution structure 510. Unlike the first vertical connection structure 211, the second vertical connection structure 212 may be a dummy structure that is not electrically connected to the interconnection structure 124. The second vertical connection structure 212 may serve as a dam for the underfill layer 223 together with the connection structure 320. The second vertical connection structure 212 may support the connection structure 320 below the connection structure 320, so that the connection structure 320 is fixed thereto to serve as a dam for the underfill layer 223. The second vertical connection structure 212 may be in contact with the connection insulating layer 321, and provide a path for dissipating heat transferred to the connection insulating layer 321. In this case, the second redistribution structure 510 may be in contact with the second vertical connection structure 212, and provide a path for dissipating heat transferred to the second vertical connection structure 212. In addition, the second redistribution structure 510 may be in contact with the second semiconductor chip 220, and provide a path for dissipating heat generated in the second semiconductor chip 220. An area of the second vertical connection structure 212 in a horizontal direction may have a value in a range of about 0.10% to about 50% of an area of the substrate 110 in a horizontal direction. A distance d2 between the second vertical connection structure 212 and the second semiconductor chip 220 may have a value in a range of about 0.001 mm to about 1 mm. A width W1 of the second vertical connection structure 212 may have a value in a range of about 0.001 mm to about 1 mm. A height h1 of the second vertical connection structure 212 may have a value in a range of about 0.001 mm to about 1 m. The second vertical connection structure 212 may be completely filled with a conductive material, and may extend in a first direction horizontal to the side surface of the second semiconductor chip 220.

The connection structure 320 may include a connection insulating layer 321, a first connection via 322, a connection interconnection 323, a second connection via 324, and a connection pad 325.

The connection insulating layer 321 may be disposed below the first redistribution structure 410 and the circuit layer 120. An upper surface of the connection insulating layer 321 may be in contact with a lower surface of a first redistribution insulating layer 411 and a lower surface of the interlayer insulating layer 121. The connection insulating layer 321 may surround a portion of the first redistribution layer 412, the first and second connection vias 322 and 324, the connection interconnection 323, and the connection pad 325. A side surface of the connection insulating layer 321 may be in contact with a side surface of the underfill layer 223. The connection insulating layer 321 may serve as a dam for the underfill layer 223. Specifically, the connection insulating layer 321 may block the underfill layer 223 to prevent the underfill layer 223 from spreading in a direction of the circuit layer 120. A distance d1 between the connection insulating layer 321 and the second semiconductor chip 220 may have a value in a range of about 0.001 mm to about 1 mm. An upper surface of the connection insulating layer 321 and a side surface of the connection insulating layer 321 may form an obtuse angle, and the connection insulating layer 321 may have a trapezoidal shape. The connection insulating layer 321 may be in contact with a connection interconnection 323, and provide a path for dissipating heat generated in the connection interconnection 323.

The first connection via 322 may be disposed below the first redistribution layer 412. The first connection via 322 may be surrounded by a connection insulating layer 321. The first connection via 322 may be connected to each of the first redistribution layer 412 and the connection interconnection 323. An upper width of the first connection via 322 may be narrower than a lower width thereof, and may have an inclined side surface of which a width increases toward the connection interconnection 323.

The connection interconnection 323 may be disposed below first and second connection vias 322 and 324. The connection interconnection 323 may be surrounded by the connection insulating layer 321. The connection interconnection 323 may be connected to each of the first and second connection vias 322 and 324. The connection interconnection 323 may be electrically connected to a first redistribution layer 412 through the first connection via 322, and may be electrically connected to the interconnection structure 124 through the second connection via 324. The connection interconnection 323 may serve as a path for electrically connecting the first redistribution layer 412 and the interconnection structure 124.

The second connection via 324 may be disposed below the interconnection structure 124. The second connection via 324 may be surrounded by a connection insulating layer 321. The second connection via 324 may be connected to the connection interconnection 323, and may be electrically connected to the interconnection structure 124 through a connection pad 325. An upper width of the second connection via 324 may be narrower than a lower width, and the second connection via 324 may have an inclined side surface of which a width increases toward the connection interconnection 323.

The connection pad 325 may be disposed between the interconnection structure 124 and the second connection via 324. The connection pad 325 may be formed together when the first redistribution layer 412 is formed, and may include the same material as the first redistribution layer 412. The connection pad 325 may be connected to each of the interconnection structure 124 and the second connection via 324.

The first redistribution structure 410 may be disposed adjacent to the circuit layer 120 below the substrate 110, and include the first redistribution insulating layer 411, the first redistribution layer 412, and the first redistribution via 413. The first redistribution insulating layer 411 may include an insulating resin. The insulating resin may include a thermosetting resin such as an epoxy resin, a thermoplastic resin such as polyimide, or a resin impregnated with an inorganic filler and/or glass fiber in these resins, for example, prepreg, an Ajinomoto Build-up Film (ABF), FR-4, and Bismaleimide Triazine (BT), or a photosensitive resin such as Photo-Imageable Dielectric (PID). The first redistribution insulating layer 411 may include a plurality of first redistribution insulating layers 411 stacked in a vertical direction (Z-axis direction). Depending on the process, a boundary between the plurality of first redistribution insulating layers 411 may be unclear. A height of the first redistribution structure 410 may be the same as a height of the circuit layer 120, and in some example embodiments, the height of the first redistribution structure 410 may be greater than the height of the circuit layer 120.

The first redistribution layer 412 may be disposed below the first redistribution insulating layer 411, may be electrically connected to the second semiconductor chip 220 through the bumps 222, and may be connected to the interconnection structure 124 through the first connection via 322. The first redistribution layer 412 may include, for example, copper (Cu), aluminum (Al), silver (Ag), tin (Sn), gold (Au), nickel (Ni), lead (Pb), titanium (Ti), or a metal material including an alloy thereof. The first redistribution layer 412 may include, for example, a ground pattern, a power pattern, and a signal pattern.

The first redistribution via 413 may penetrate through the first redistribution insulating layer 411. The first redistribution via 413 may include a metal material similar to that of the first redistribution layers 412. The first redistribution via 413 may have, for example, a form of a filled-type via in which a metal material is filled inside a via-hole or a form of a conformal via in which a metal material is formed along an inner wall of the via-hole. The first redistribution via 413 may be integrated with the first redistribution layer 412, but an example embodiment thereof is not limited thereto.

The second redistribution structure 510 is disposed below the encapsulant 230 and the second semiconductor chip 220, and may include the second redistribution insulating layer 511, the second redistribution layer 512, and the second redistribution via 513. The second redistribution insulating layer 511 may include an insulating resin. The insulating resin may include a thermosetting resin such as an epoxy resin, a thermoplastic resin such as polyimide, or a resin impregnated with an inorganic filler and/or glass fiber (Glass Fiber, Glass Cloth, Glass Fabric) in these resins, for example, prepreg, an Ajinomoto Build-up Film (ABF), FR-4, and Bismaleimide Triazine (BT), or a photosensitive resin such as Photo-Imageable Dielectric (PID). The second redistribution insulating layer 511 may include a plurality of second redistribution insulating layers 511 stacked in a vertical direction (Z-axis direction). Depending on the process, a boundary between the plurality of second redistribution insulating layers 511 may be unclear.

The second redistribution layer 512 may be disposed below the second redistribution insulating layer 511, and may be electrically connected to the interconnection structure 124 through the first vertical connection structure 211. The second redistribution layer 512 may include a metal material, for example, copper (Cu), aluminum (Al), silver (Ag), tin (Sn), gold (Au), nickel (Ni), lead (Pb), titanium (Ti), or an alloy thereof. The second redistribution layer 512 may include, for example, a ground pattern, a power pattern, and a signal pattern. For example, a lowermost second redistribution layer 512 among the second redistribution layers 512 may be formed to be thicker than redistribution layers 512 thereabove, so connection reliability of the external connection terminal 520 may be secured.

The second redistribution via 513 may penetrate the second redistribution insulating layer 511 to electrically connect the second redistribution layer 512 to the first vertical connection structure 211. The second redistribution via 513 may include a metal material similar to that of the second redistribution layers 512. The second redistribution via 513 may have a form of a filled-type via in which a metal material is filled inside a via-hole or a form of a conformal via in which a metal material is formed along an inner wall of the via-hole. The second redistribution via 513 may be integrated with the second redistribution layer 512, but an example embodiment thereof is not limited thereto.

The external connection terminal 520 may be disposed below the second redistribution structure 510. The external connection terminal 520 may include tin (Sn), indium (In), bismuth (Bi), antimony (Sb), copper (Cu), silver (Ag), zinc (Zn), lead (Pb), and/or alloys thereof.

Figure 3:
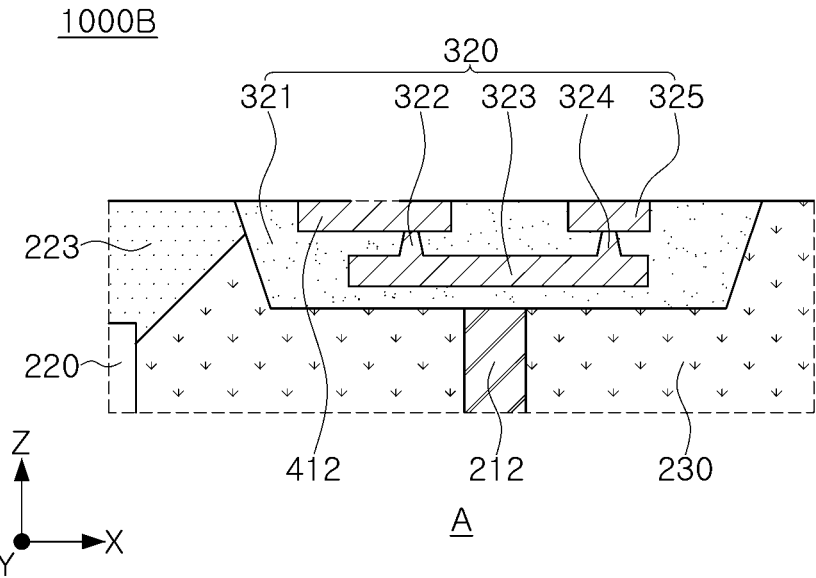
FIG. 3 is a partially enlarged view of a semiconductor package according to an example embodiment.

FIG. 3 is a partially enlarged view of a semiconductor package according to an example embodiment.

Referring to FIG. 3, in a semiconductor package 1000B, a connection insulating layer 321 may have a region overlapping an underfill layer 223 in a horizontal direction, and a side surface of the connection insulating layer 321 may be in contact with a side surface of the underfill layer 223. While the connection insulating layer 321 acts as a dam for the underfill layer 223, the connection insulating layer 321 may have the same shape as the underfill layer 223 of the semiconductor package 1000B.

Figure 4:
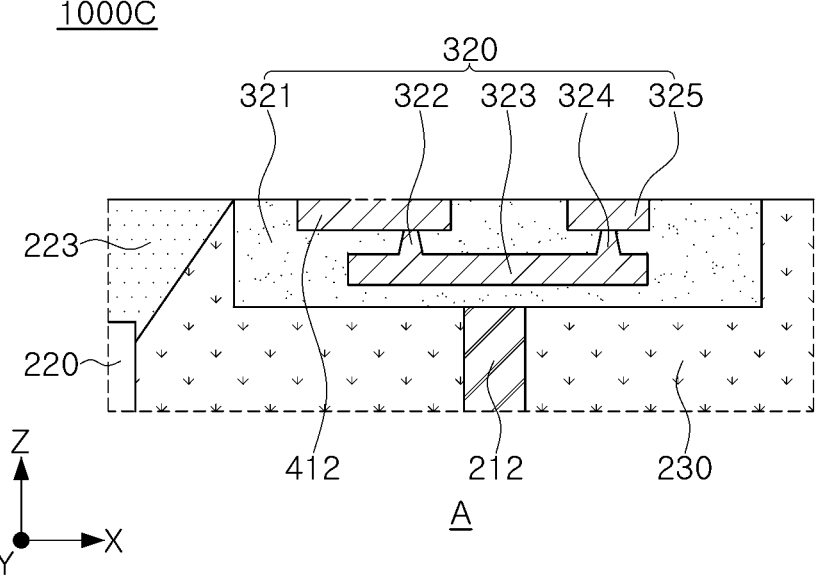
FIG. 4 is a partially enlarged view of a semiconductor package according to an example embodiment.

FIG. 4 is a partially enlarged view of a semiconductor package according to an example embodiment.

Referring to FIG. 4, in a semiconductor package 1000C, a connection insulating layer 321 may have a rectangular shape. Accordingly, an upper surface of the connection insulating layer 321 and a side surface of the connection insulating layer 321 may form right angles. During a manufacturing process of the semiconductor package 1000C, a portion of the connection insulating layer 321 is removed by an etching process, so that it may have the same shape as the connection insulating layer 321 of the semiconductor package 1000C.

Figure 5:
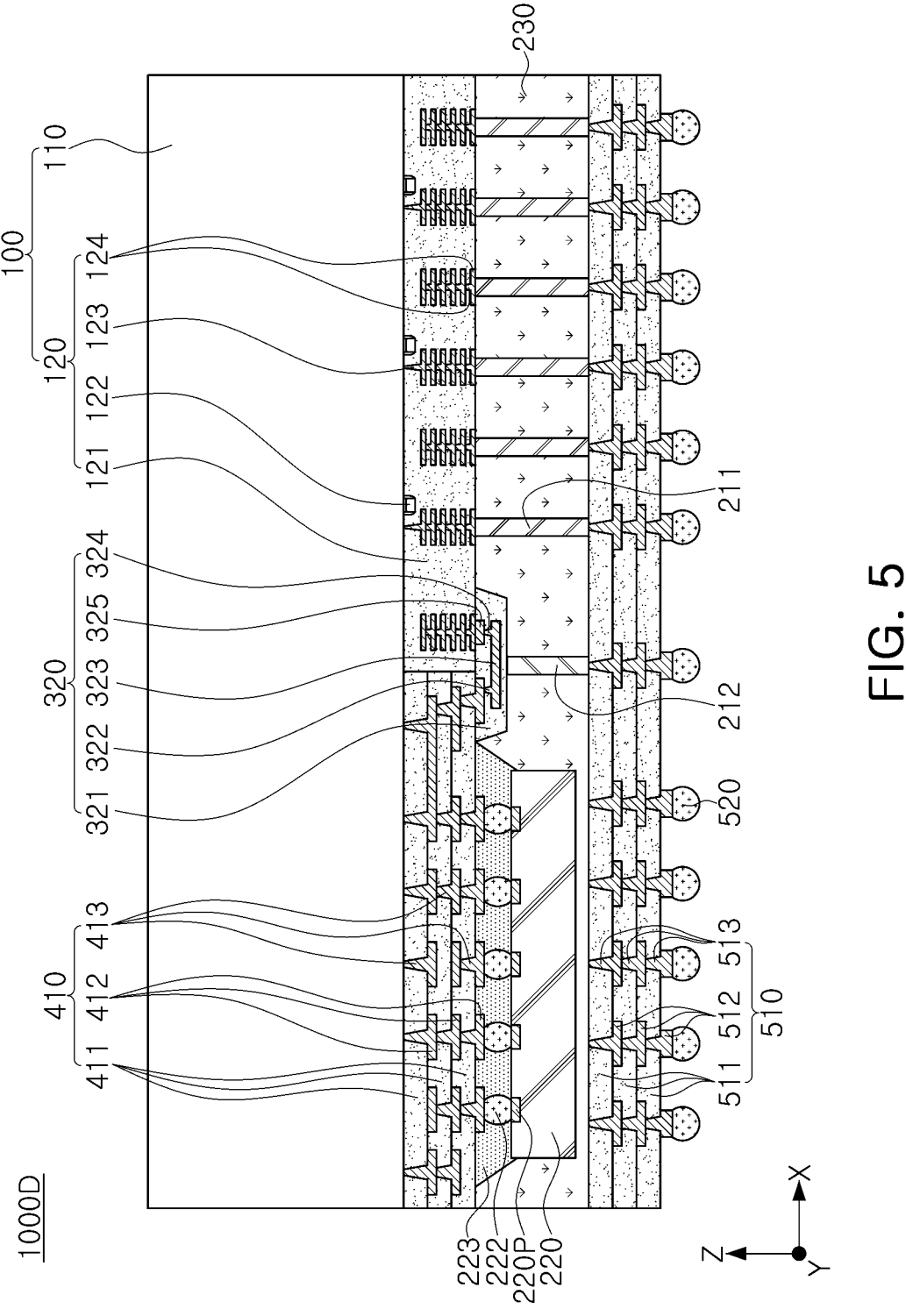
FIG. 5 is a cross-sectional view of a semiconductor package according to an example embodiment.

FIG. 5 is a cross-sectional view of a semiconductor package according to an example embodiment.

Referring to FIG. 5, in a semiconductor package 1000D, an encapsulant 230 may be disposed between a second semiconductor chip 220 and a second redistribution structure 510. In addition, a lower surface of the second semiconductor chip 220 may be located on a higher level than lower surfaces of the first and second vertical connection structures 211 and 212.

Figure 6:
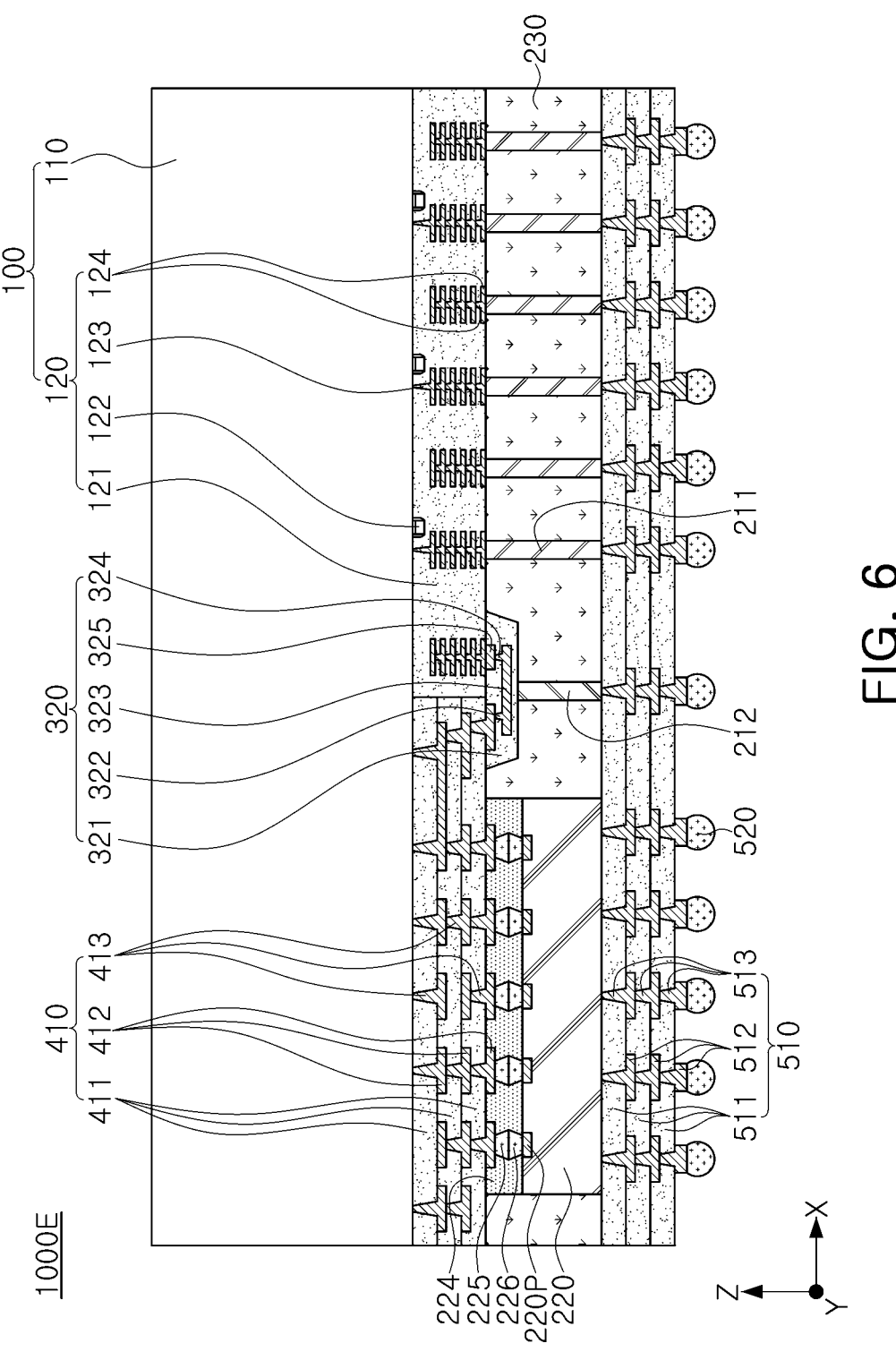
FIG. 6 is a cross-sectional view of a semiconductor package according to an example embodiment.

FIG. 6 is a cross-sectional view of a semiconductor package according to an example embodiment.

Referring to FIG. 6, in a semiconductor package 1000E, a first bonding pad 225 and a second bonding pad 226 may be disposed between a first redistribution layer 412 and a connection pad 220P A lower surface of the first bonding pad 225 may be in contact with an upper surface of the second bonding pad 226. A bonding insulating layer 224 may be disposed between the first redistribution structure 410 and the second semiconductor chip 220. The bonding insulating layer 224 may surround at least a portion of the first and second bonding pads 225 and 226. The first and second bonding pads 225 and 226 may include copper, and the bonding insulation layer 224 may include silicon oxide. The first and second bonding pad 225 and 226 and the bonding insulating layer 224 may be formed by Cu to Cu Hybrid Bonding.

FIGS. 7 to 13 are cross-sectional views to illustrate a manufacturing method of a semiconductor package according to an example embodiment.

Figure 7:
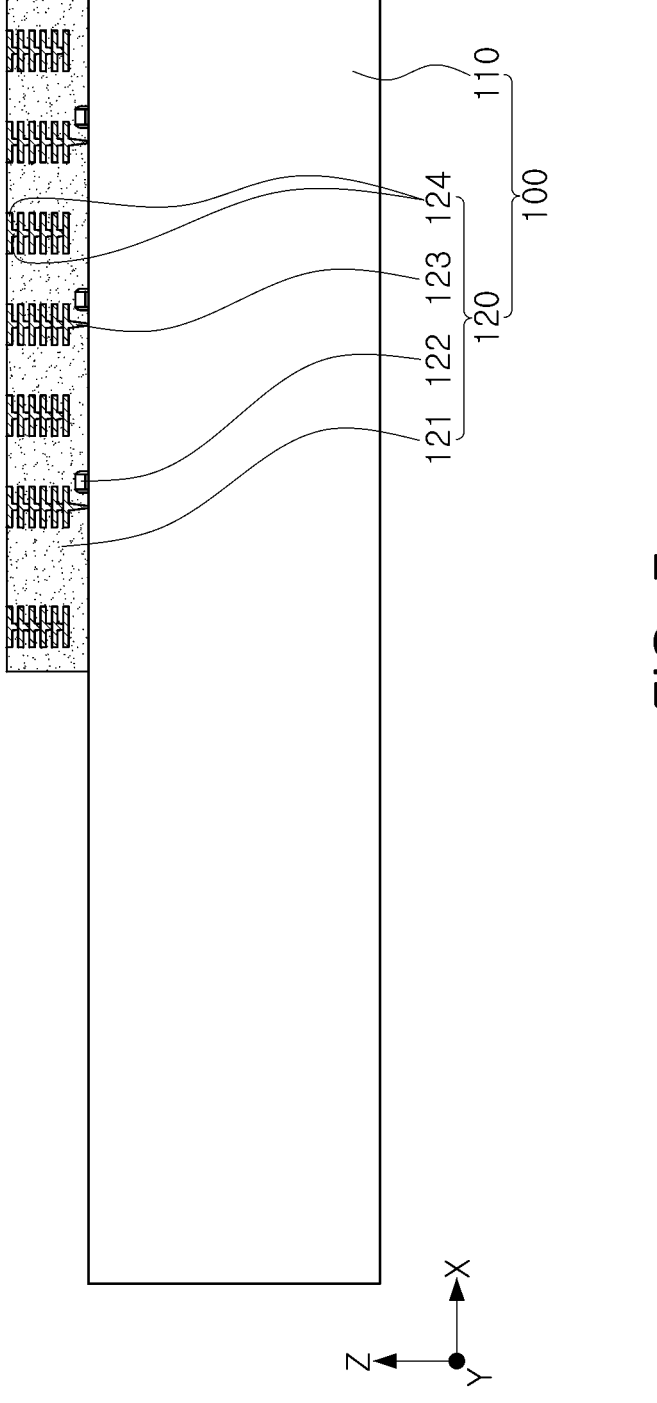
FIGS. 7 to 13 are cross-sectional views illustrating a method of manufacturing a semiconductor package according to an example embodiment.

Referring to FIG. 7, an interlayer insulating layer 121, individual devices 122, an interconnection portion 123, and an interconnection structure 124 are formed on a substrate 110. First, individual devices 122 are formed on the substrate 110. The interconnection portion 123 and the interconnection structure 124 may be formed, by forming a portion of the interlayer insulating layer 121, then removing the portion thereof by etching and filling a conductive material therein.

Figure 8:
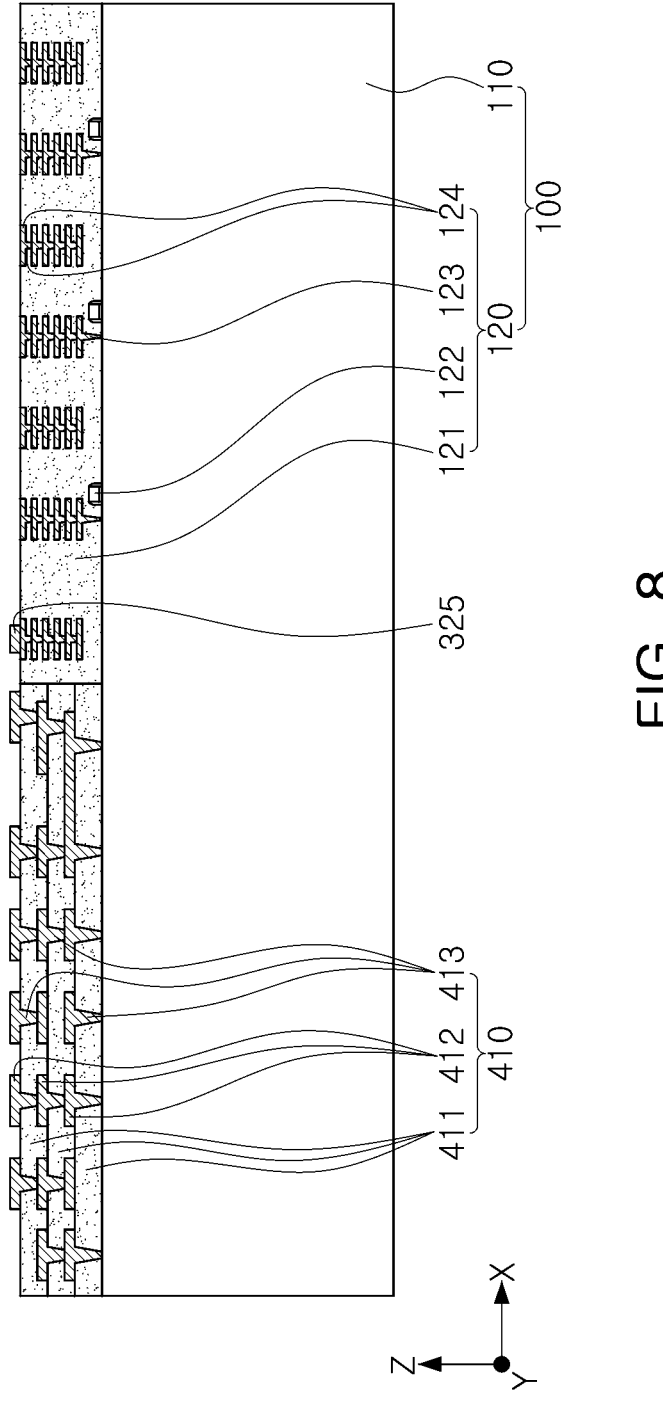

Referring to FIG. 8, a first redistribution structure 410 may be formed.

First, a first redistribution insulating layer 411 disposed on the substrate 110 and a via-hole penetrating through the first redistribution insulating layer 411 may be formed. The first redistribution insulating layer 411 may be formed by coating and curing an insulating resin. The insulating resin may include a thermosetting resin such as an epoxy resin, a thermoplastic resin such as polyimide, or a resin impregnated with an inorganic filler and/or glass fiber (Glass Fiber, Glass Cloth, Glass Fabric) in these resins, for example, prepreg, an Ajinomoto Build-up Film (ABF), FR-4, and Bismaleimide Triazine (BT). The via-hole may be formed by a photolithography process and/or an etching process. Here, the photolithography process may include a series of processes including an exposure process, a developing process, and a cleaning process.

Next, a first redistribution via 413 penetrating through the first redistribution insulating layer 411 may be formed. The first redistribution layer 412 and the first redistribution via 413 may be formed by performing a plating process. For example, after coating a photoresist (not shown) on the first redistribution insulating layer 411, a photoresist may be patterned using a photolithography process. The patterned photoresist (not shown) may expose via-holes. Before coating the photoresist (not shown), a seed layer (not shown)

may be formed on an inner wall of the via-hole. A plating process may be performed using the patterned photoresist (not shown) and the seed layer (not shown). The first redistribution layer 412 and the first redistribution via 413 may include a metal material such as copper (Cu) or an alloy including the same.

Through the same process as described above, one layer of the first redistribution insulating layer 411, the first redistribution layer 412, and the first redistribution via 413 may be formed, and by repeating the above process, a plurality of layers of the first redistribution insulating layers 411, the first redistribution layers 412, and the first redistribution vias 413 may be formed.

Figure 9:
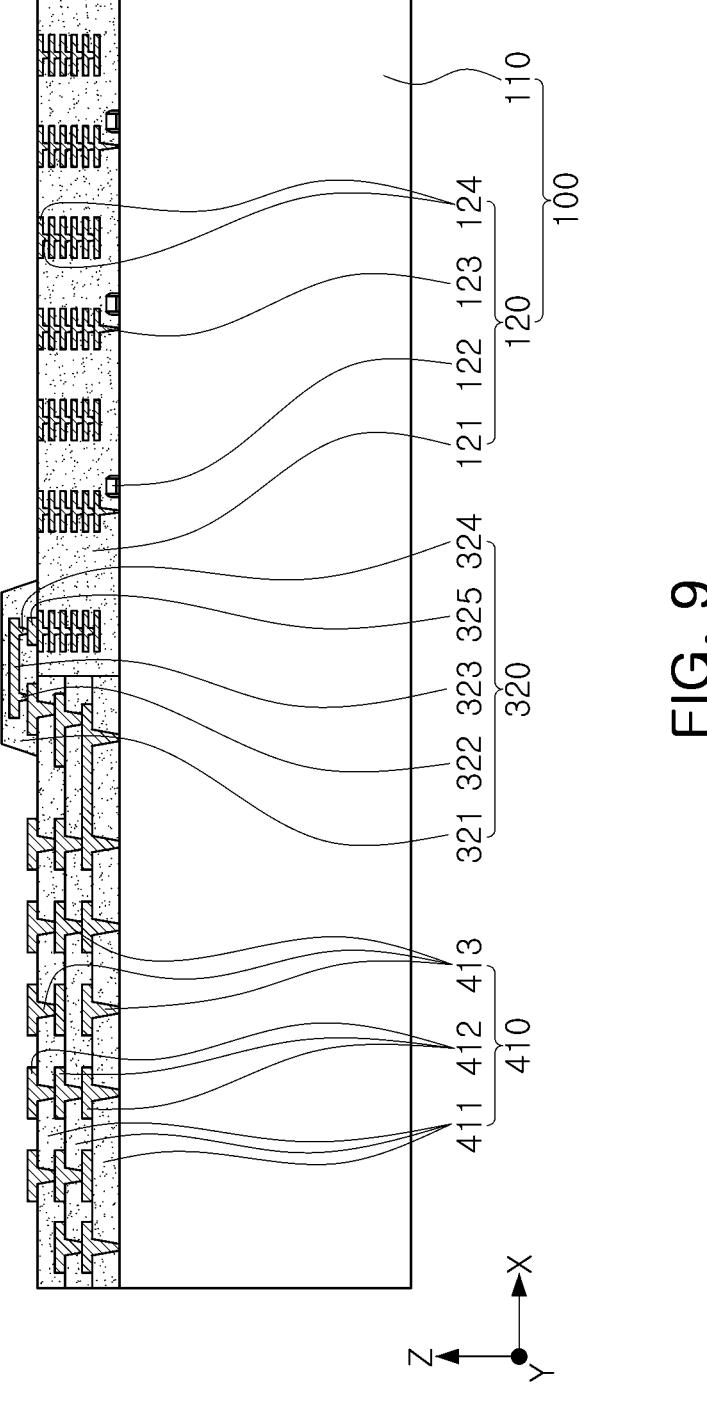

Referring to FIG. 9, a connection structure 320 may be formed.

First, a portion of the connection insulating layer 321 is formed. Next, first and second connection vias 322 and 324 penetrating through the connection insulating layer 321 may be formed. A connection interconnection 323 and the first and second connection vias 322 and 324 may be formed by performing a plating process. Next, a connection insulating layer 321 may be formed by additionally applying an insulating material. In some example embodiments, the connection interconnection 323 and the first and second connection vias 322 and 324 may be formed by etching a portion of the connection insulating layer 321 and applying a conductive material thereto.

Figure 10:
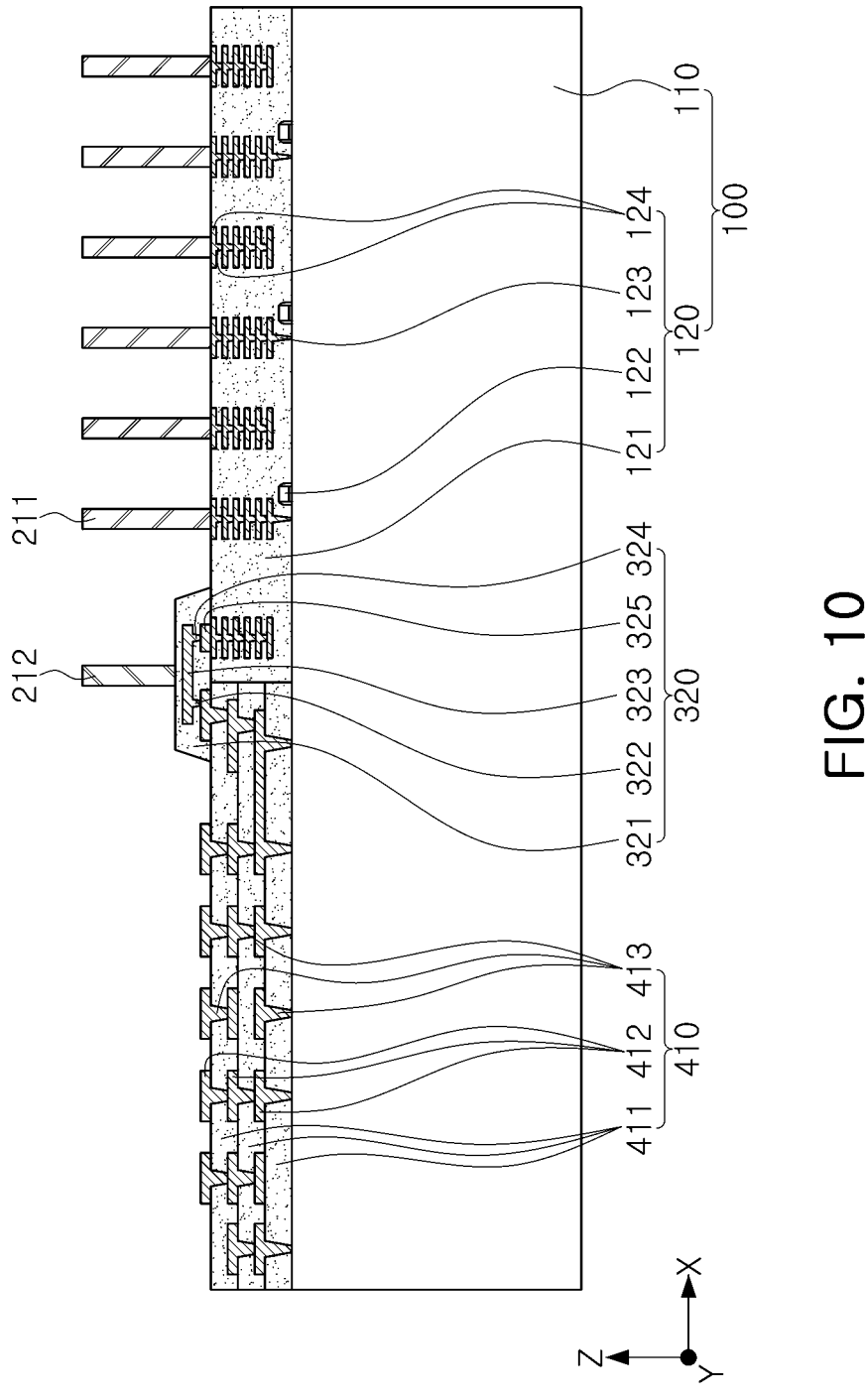

Referring to FIG. 10, first and second vertical connection structures 211 and 212 may be formed.

First, a photoresist pattern is formed on upper surfaces of the connection structure 320 and the circuit layer 120. The photoresist pattern may include an opening defining a region in which the first and second vertical connection structures 211 and 212 formed through a subsequent process will be formed. The first and second vertical connection structures 211 and 212 may be formed in the opening of the photoresist pattern. The first and second vertical connection structures 211 and 212 may be formed to fill at least a portion of the opening of the photoresist pattern, and may be formed of copper (Cu), but an example embodiment thereof is not limited thereto.

A polishing process may be performed on the photoresist pattern and the first and second vertical connection structures 211 and 212 until a planarized surface is obtained on an upper surface of the photoresist pattern and an upper surface of the first and second vertical connection structures 211 and 212. For example, in order to obtain a planarized surface, etch-back, chemical mechanical polishing (CMP), or the like may be performed. Through the polishing process, the upper surface of the photoresist pattern may be on the same plane as the upper surfaces of the first and second vertical connection structures 211 and 212. In example embodiments, when grinding the photoresist pattern and the first and second vertical connection structures 211 and 212 through a CMP process, CMP process conditions, for example, pressure and a rotational speed of a polishing head, the type of slurry, and the like, may be adjusted so that the planarized surfaces of the first and second vertical connection structures 211 and 212 are not greatly roughened.

Next, a photoresist pattern is removed. For example, the photoresist pattern may be removed by a strip process.

Figure 11:
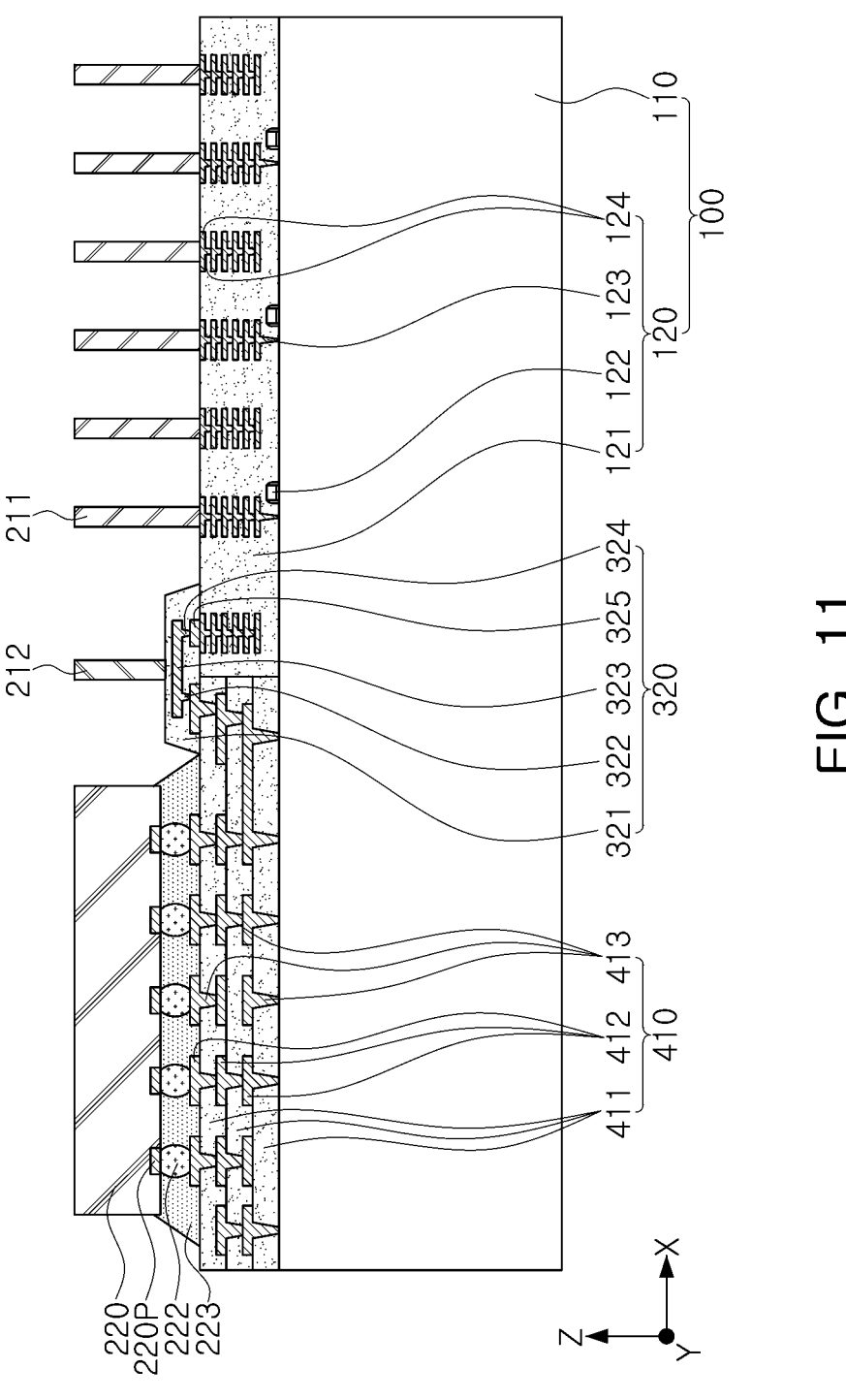

Referring to FIG. 11, a second semiconductor chip 220 may be mounted on a first redistribution structure 410. Bumps 222 may be disposed on a lower surface of the connection pad 220P and mounted on the first redistribution structure 410 together with the second semiconductor chip 220. In this case, an underfill layer 223 may serve to fix the second semiconductor chip 220 to the first redistribution structure 410. A connection structure 320 may prevent the underfill layer 223 from spreading in a direction of the circuit layer 120.

Figure 12:
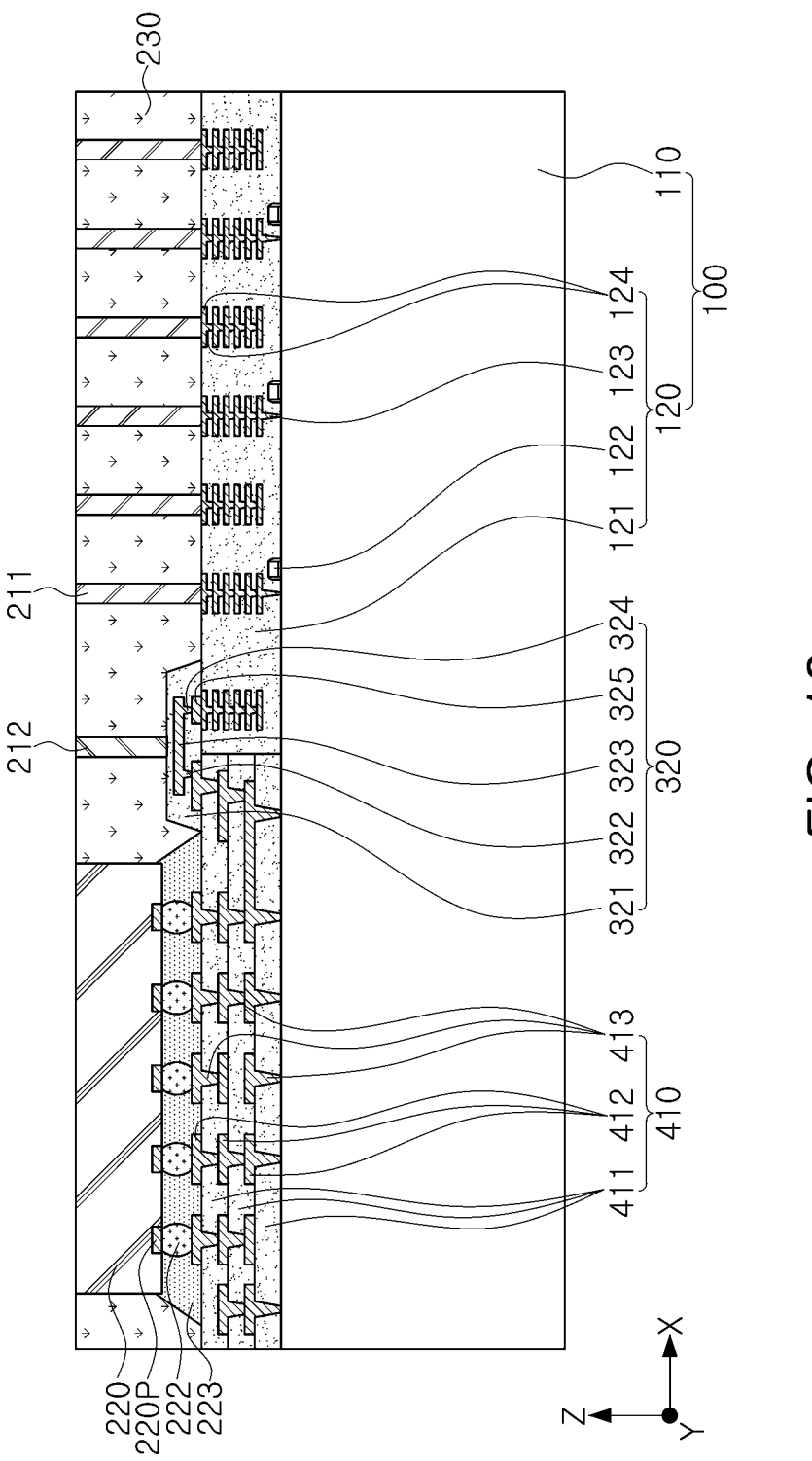

Referring to FIG. 12, an encapsulant 230 for encapsulating at least a portion of each of the first and second vertical connection structures 211 and 212, the second semiconductor chip 220, and the connection structure 320 may be formed.

An encapsulant 230 may be formed by laminating ABF and then curing the same. The encapsulant 230 may be formed to cover the first and second vertical connection structures 211 and 212, the second semiconductor chip 220, and the connection structure 320, and an upper surface of the encapsulant 230 may be in a non-planarized state.

Next, the encapsulant 230 may be grinded so that the first and second vertical connection structures 211 and 212 and the second semiconductor chip 220 are exposed. Accordingly, the upper surface of the encapsulant 230 may be disposed on substantially the same level as upper surfaces of the first and second vertical connection structures 211 and 212 and the second semiconductor chip 220, and the upper surface of the encapsulant 230 may be coplanar with the upper surfaces of the first and second vertical connection structures 211 and 212 and the second semiconductor chip 220.

Figure 13:
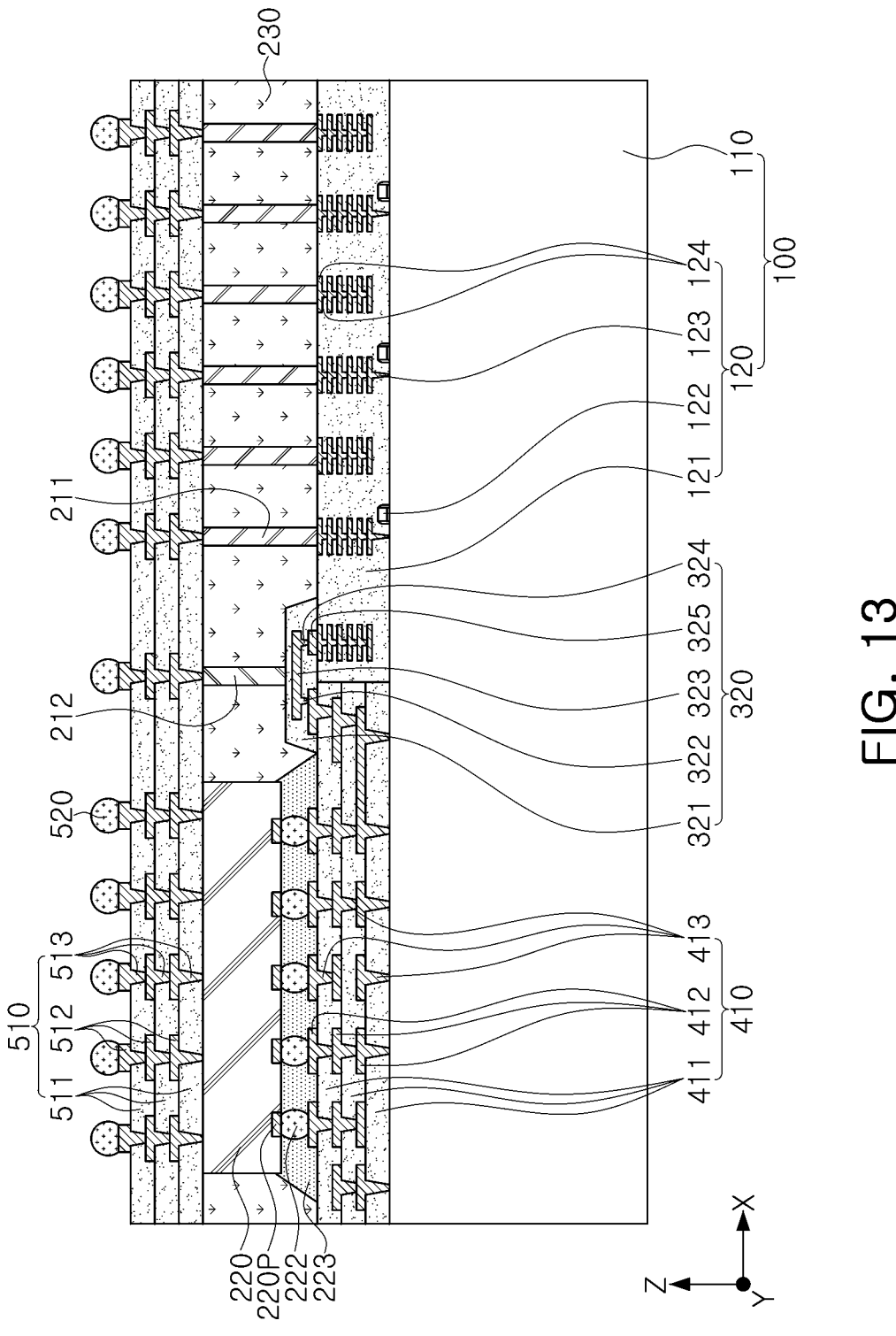

Referring to FIG. 13, a second redistribution structure 510 and an external connection terminal 520 may be formed. The second redistribution structure 510 may be formed in the same manner as the first redistribution structure 410. The external connection terminal 520 may be formed by various methods, for example, the external connection terminal 520 may be performed by methods such as disposing and reflowing a conductor such as a solder ball, forming and plating a seed layer, or the like.

Accordingly, the semiconductor package 1000A of FIGS. 1 to 2 may be finally manufactured according to an example embodiment.

As set forth above, according to example embodiments, by disposing a circuit layer and a redistribution layer adjacent to each other, and connecting the circuit layer and the redistribution layer through a connection interconnection, a semiconductor package having improved electrical characteristics and reliability may be provided.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not necessarily refer to the same example embodiment. Also, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

While aspects of example embodiments have been particularly shown and described, it will be understood that various changes in form and details may be made therein without departing from the spirit and scope of the following claims.

What is claimed is:

1. A semiconductor package comprising:
a substrate;
a circuit layer disposed on a lower surface of the substrate, the circuit layer comprising an interconnection structure;
a first redistribution structure disposed adjacent to the circuit layer on the lower surface of the substrate, the first redistribution structure comprising a first redistribution layer;
a connection structure comprising:
a first connection via electrically connected to the first redistribution layer;
a second connection via electrically connected to the interconnection structure; and
a connection interconnection disposed below the first connection via and the second connection via and interconnecting the first connection via and the second connection via;
a semiconductor chip disposed below the first redistribution structure, and electrically connected to the first redistribution layer;
a first vertical connection structure disposed on a lower surface of the circuit layer;
a second vertical connection structure disposed on a lower surface of the connection structure; and
a second redistribution structure disposed below the semiconductor chip and the first and second vertical connection structures, the second redistribution structure comprising a second redistribution layer.

2. The semiconductor package of claim 1, wherein the second vertical connection structure extends in a first direction, parallel to a side surface of the semiconductor chip.

3. The semiconductor package of claim 1, wherein the connection structure further comprises a connection pad disposed on an upper surface of the second connection via, and
wherein the connection pad is connected to the interconnection structure and the second connection via.

4. The semiconductor package of claim 1, wherein the semiconductor chip further comprises a connection pad disposed on an upper surface of the semiconductor chip,
wherein the first redistribution structure comprises first redistribution layers, and
wherein the semiconductor package further comprises a bump disposed between a lower surface of a lowermost first redistribution layer among the first redistribution layers and an upper surface of the connection pad.

5. The semiconductor package of claim 1, wherein the semiconductor chip further comprises a connection pad disposed on an upper surface of the semiconductor chip, wherein the first redistribution structure comprises first redistribution layers, wherein the semiconductor package further comprises a first bonding pad disposed on a lower surface of a lowermost first redistribution layer among the first redistribution layers and a second bonding pad disposed on an upper surface of the connection pad, and wherein a lower surface of the first bonding pad contacts an upper surface of the second bonding pad.

6. The semiconductor package of claim 1, wherein the second redistribution structure further comprises a second redistribution via connected to the second redistribution layer, and wherein a lower surface of the semiconductor chip contacts an upper surface of the second redistribution via.

7. The semiconductor package of claim 1, wherein the semiconductor package further comprises an encapsulant encapsulating at least a portion of each of the first and second vertical connection structures, the semiconductor chip, and the connection structure.

8. The semiconductor package of claim 1, wherein a distance between the semiconductor chip and the second vertical connection structure is in a range of about 0.001 mm to about 1 mm.

9. The semiconductor package of claim 1, wherein the connection structure further comprises a connection insulating layer covering the connection interconnection, and wherein a distance between the semiconductor chip and the connection insulating layer is in a range of about 0.001 mm to about 1 mm.

10. The semiconductor package of claim 1, wherein an area of the semiconductor chip is in a range of about 5% to about 99% of an area of the substrate, and wherein an area of the second vertical connection structure is in a range of about 0.10% to about 50% of the area of the substrate.

11. The semiconductor package of claim 1, wherein a width of the second vertical connection structure is in a range of about 0.001 mm to about 1 mm, and wherein a height of the second vertical connection structure is in a range of about 0.001 mm to about 1 mm.

12. The semiconductor package of claim 1, wherein a height of the substrate is in a range of about 0.005 mm to about 1 mm, and wherein a sum of a height of the circuit layer, a height of the first vertical connection structure, and a height of the second redistribution structure is in a range of about 0.01 mm to about 1 mm.

13. The semiconductor package of claim 1, wherein a height of the first redistribution structure is greater than a height of the circuit layer.

14. A semiconductor package comprising:

a substrate;

a circuit layer disposed on a lower surface of the substrate, the circuit layer comprising an interconnection structure and an interlayer insulating layer surrounding the interconnection structure;

a first redistribution structure disposed adjacent to the circuit layer on the lower surface of the substrate, the first redistribution structure comprising a first redistribution layer and a first redistribution insulating layer surrounding the first redistribution layer;

a connection insulating layer having an upper surface contacting a lower surface of the first redistribution insulating layer and a lower surface of the interlayer insulating layer;

a semiconductor chip disposed below the first redistribution structure and electrically connected to the first redistribution layer;

an underfill layer disposed between the first redistribution structure and the semiconductor chip;

a first vertical connection structure disposed on a lower surface of the circuit layer;

a second vertical connection structure disposed on a lower surface of the connection insulating layer; and a second redistribution structure disposed below the first vertical connection structure and the second vertical connection structure, the second redistribution structure comprising a second redistribution layer, wherein the interlayer insulating layer and the first redistribution insulating layer comprise different materials.

15. The semiconductor package of claim 14, wherein the interlayer insulating layer comprises silicon oxide, and wherein the first redistribution insulating layer comprises a photosensitive insulating material.

16. The semiconductor package of claim 14, wherein the upper surface of the connection insulating layer and a side surface of the connection insulating layer form a right angle.

17. The semiconductor package of claim 14, wherein the upper surface of the connection insulating layer and a side surface of the connection insulating layer form an obtuse angle.

18. A semiconductor package, comprising:

a substrate;

a circuit layer disposed on a lower surface of the substrate, the circuit layer comprising an interconnection structure;

a first redistribution structure disposed adjacent to the circuit layer on the lower surface of the substrate, the first redistribution structure comprising a first redistribution layer;

a connection structure comprising:

a connection interconnection electrically connected to the interconnection structure and the first redistribution layer; and a connection insulating layer covering the connection interconnection;

a semiconductor chip disposed below the first redistribution structure, and electrically connected to the first redistribution layer;

a first vertical connection structure disposed on a lower surface of the circuit layer;

a second vertical connection structure disposed on a lower surface of the connection structure; and a second redistribution structure disposed below the first and second vertical connection structures, the second redistribution structure comprising a second redistribution layer, wherein the second vertical connection structure contacts the connection insulating layer, and is electrically connected to the second redistribution layer.

19. The semiconductor package of claim 18, wherein the second redistribution structure further comprises second redistribution vias connecting the second redistribution layer and the second vertical connection structure.

20. The semiconductor package of claim 18, wherein a height of the second vertical connection structure is smaller than a height of the first vertical connection structure.

* * * * *